United States Patent [19]

Yamazaki

[11] Patent Number: 5,034,784
[45] Date of Patent: Jul. 23, 1991

[54] DIAMOND ELECTRIC DEVICE ON SILICON

[75] Inventor: Shunpei Yamazaki, Tokyo, Japan

[73] Assignee: Semiconductor Energy Laboratory Co., Ltd., Kanagawa, Japan

[21] Appl. No.: 535,156

[22] Filed: Jun. 8, 1990

[30] Foreign Application Priority Data

Jun. 22, 1989 [JP] Japan .................................. 1-159865

[51] Int. Cl.⁵ ............................................. H01L 33/00
[52] U.S. Cl. ...................................... 357/17; 357/16; 357/65; 437/100; 437/126
[58] Field of Search ...................... 357/17, 16, 4, 30 E, 357/65; 437/100, 126, 131, 132, 965

[56] References Cited

U.S. PATENT DOCUMENTS

| | | | |
|---|---|---|---|
| 4,478,654 | 10/1984 | Gau et al. | 357/17 X |
| 4,531,142 | 7/1985 | Weyrich et al. | 357/17 |
| 4,918,497 | 4/1990 | Edmond | 357/17 |
| 4,920,387 | 4/1990 | Takasu et al. | |
| 4,981,818 | 1/1991 | Anthony et al. | 437/100 X |

FOREIGN PATENT DOCUMENTS 60-192326 9/1985 Japan .................................. 437/126
63-145788 6/1988 Japan .

Primary Examiner—William Mintel
Attorney, Agent, or Firm—Sixbey, Friedman, Leedom & Ferguson

[57] ABSTRACT

A diamond electric device is described. The device comprises a diamond film deposited on a semiconductor substrate and an upper electrode. The electrical contact between the diamond film and the electrode is formed only through an intervening silicon semiconductor film which prevents direct contact between the diamond film and the electrode. By this structure, the stability of electric performance is substantially improved.

25 Claims, 2 Drawing Sheets

DIAMOND ELECTRIC DEVICE ON SILICON

BACKGROUND OF THE INVENTION

1. Field of the Invention

The present invention relates to diamond electric devices and, more particularly to diamond semiconductor electric devices such as light emitting devices.

2. Description of the Prior Art

For emission of reddish light rays, GaAs semiconductors have been utilized to manufacture light emitting devices for more than a decade. The emission of blue or green light, as well as white light, however, has long been hardly realized by means of solid state devices.

The inventor has before proposed to make a light emitting device from diamond which can emit light at short wave lengths, for example, as described in Japanese Patent Application No. sho 56-146, 930 filed on Sept. 17, 1981. Diamond is promising, as a light emitting substance for mass production, because of its high thermal resistance, chemically stabilities and low price, in view of a great demand for light emitting devices in the market. It is, however, very difficult to manufacture diamond light emitting devices at a high yield required for commericalization because there are formed a large proportion of products whose efficiencies are undesirably too low to satisfy the requirement of the application thereof.

SUMMARY OF THE INVENTION

It is an object of the present invention to provide an electric device with a diamond film having a high performance.

It is another object of the present ivention to provide a diamond electric device having a long life time.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

The present invention has been made based upon the discovery of the origin of the low yield of diamond light emitting device manufacture. The light emitting action of diamond light emitting devices takes place when a relatively large current is passed through diamond crystals by applying a voltage between a pair of electrodes sandwiching the diamond crystals. The electric energy carried by the current, however, is consumed largely only to produce heat rather than to emit light rays. The inventor succeeded in the discovery of the origin of the low efficiencies and the heat generation. As a result, it has been found that schottoky contacts between diamond films and metal electrodes can not be formed with stable characteristics and desired performance. Diamond films hardly make good electric contact with metal surfaces. Furthermore, it is very difficult to deposit a diamond film having an n-type conductivity while the formation of p-type diamond films is relatively easy.

In order to accomplish the foregoing and other objects and advantages, it is proposed to employ usual semiconductor films such as silicon semiconductor films, which are relatively easy to use, in combination with diamond films. The direct contact between diamond and a metal is avoided in this structure. A semiconductor film is interposed between a metallic electrode and a diamond film.

By this structure, metallic electrodes make electrical contact only with usual semiconductor films and therefore metal-semiconductor contacts can be easily formed without dispersed characteristics. One of the important applications is the diamond light emitting device. Current passes through a diamond film, an intervening usual semiconductor film and an electrode. The current passing through the diamond film induces recombination of electron-hole pairs between mid-gap states (radiation centers), between the mid-gap states and a valence band, between a conduction band and the mid-gap states and between the conduction band and the valence band. The spectrum of light emitted from a diamond film is determined by differential energy levels between the mid-gap states, the bottom of the conduction band and the apex of the valence band. Depending upon the differential levels, it is possible to emit blue or green light or radiation having continuous spectrum of wavelengths over a relatively wide range such as white light. For example, when a dopant of an element of Group IIa such as zinc or cadmium or an element of Group VIb such as oxygen, sulfur, selenium or tellurium is introduced, e.g. by ion implantation, effective radiation of blue light can be observed. The associated intervening semiconductor films are doped with an element of Group IIIb such as boron, aluminum, gallium or indium, or an element of Group Vb such as nitrogen, arsenic or antimony in order to be of p-type or n-type to make good contact with a metallic electrode. These elements may be introduced also into the diamond film. The spectra of radiation, however, tends to shift from a blue region to a green region in that case.

Ion implantation is suitable for use formation of such diamond light emitting devices. The ion bombardment produces many defects in the diamond films. The defects can function as recombination centers from which light emission occurs. Preferably, after the ion implantation, the diamond film is subjected to thermal annealing in air or an oxidizing atmosphere such as oxygen or NOx atmosphere at 400° to 1000° C. By this treatment, only atomic level distortion is alleviated leaving defects, and therefore the number of recombination center is not reduced. What is more advantageous fact is that the ion implantation into the diamond film descreases the resistivity of the implanted diamond film so that current tends to flow preferentially through the implanted diamond.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

The formation of diamond films by means of chemical vapor reaction has been proposed by the applicant in Japanese Patent Application No. sho 61-292859 filed on Dec. 9, 1986 and U.S. Pat. application No. 07/178,362 filed on Feb. 6, 1988. Hereinbelow, the process of the formation of diamond will be briefed.

Figure 1:
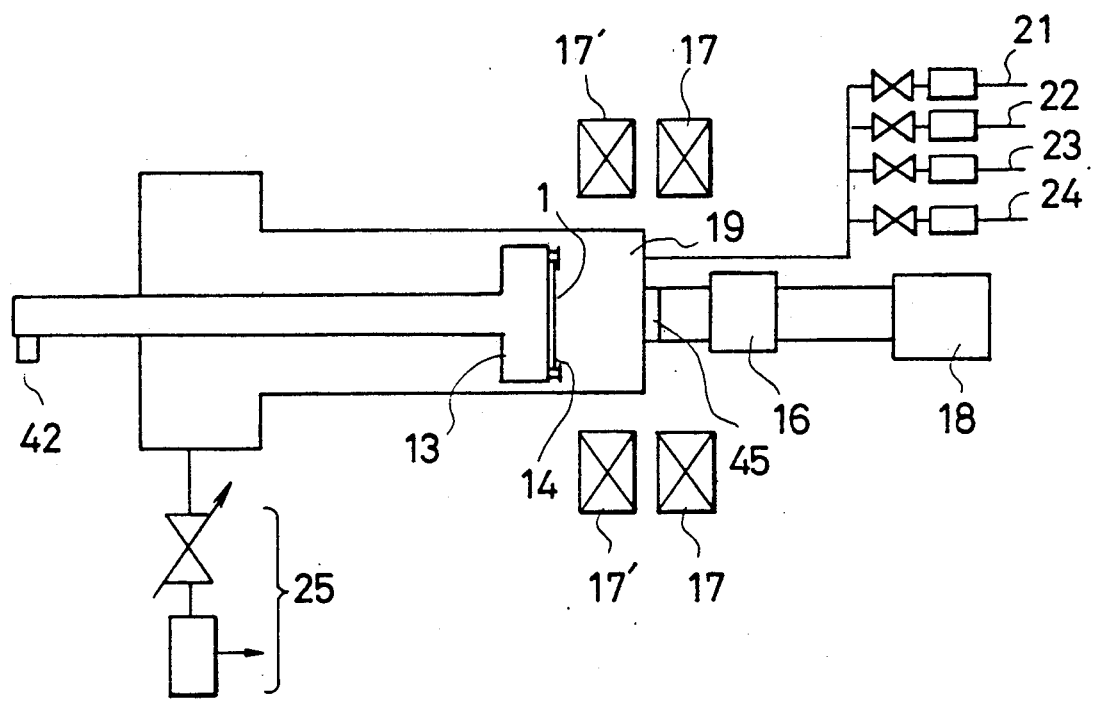
FIG. 1 is a cross sectional view showing a CVD apparatus for use in forming diamond light emitting devices in accordance with the present invention.

Referring now to FIG. 1, a microwave-assisted CVD apparatus provided with associated Helmholtz coils 17 and 17' for use in depositing diamond films is shown. The apparatus comprises a vacuum chamber defining a reaction (deposition) space 19 therein, a microwave generator 18 connected to the chamber through an attenuator 16 and a quartz window 45, a gas introduction system having four inlet ports 21 to 24, a gas evacuation system 25 coupled with the chamber through a pressure controlling valve and a substrate holder 13 provided in the chamber and with a substrate position adjusting mechanism 42 for supporting a substrate 1 at an appropriate position. By the use of the adjusting mechanism 42, the axial position of the holder can be adjusted in order to change the volume of the reactive space 19. The evacuation system functions both as a pressure controller and as a stop valve. The pressure in the chamber is adjusted by means of the valve. The inside of the chamber and the holder 13 are circular and coaxial with each other. The procedure of depositing diamond films in the apparatus is as follow.

The substrate, for example, a single crystalline silicon semiconductor wafer of 2 to 6 inches, e.g. 4 inches diameter, is mounted on the holder 13. The surface of the substrate is preferably given scratches in advance which form focuses for crystalline growth. The scratches are formed for example by putting the substrate in a liquid in which diamond fine particles are dispersed and applying ultrasonic waves thereto for 1 minute to 1 hour. After fixing the substrate 1 on the holder 13 with a keeper 14, the pressure in the reaction space 19 is reduced to $10^{-3}$ to $10^{-6}$ Torr by means of the evacuation system followed by introduction of a reactive gas to a pressure of 0.01 to 3 Torr, typically 0.1 to 1 Torr, e.g. 0.26 Torr. The reactive gas comprises an alcohol such as methyl alcohol ($CH_3OH$) or ethyl alcohol ($C_2H_5OH$) diluted with hydrogen at a volume ratio of alcohol/hydrogen=0.4 to 2. The hydrogen is introduced through the port 22 at 100 SCCM and the alcohol through the port 21 at 70 SCCM for example. The coils are energized during the deposition to induce a magnetic field having a maximum strength of 2 K Gauss and a resonating strength of 875 Gauss at the surface of the substrate 1 to be coated. Then, microwaves are applied at 1 to 5 GHz, e.g. 2.45 GHz in the direction parallel to the direction of the magnetic field to cause ionized particles of the reactive gas in the form of plasma to resonate therewith in the magnetic field. As a result, a polycrystalline film of diamond grows on the substrate. 2 hour deposition for example can form a diamond film of 0.5 to 5 micrometer thickness, e.g. 1.3 micrometers thickness. During the deposition of diamond film, carbon graphite is also deposited. However, the graphite, which is relatively chemically unstable as compared with diamond, reacts with radicals which also occur in the plasma of the alcohol and is removed from the deposited film. The temperature of the substrate 1 is elevated to 200° C. to 1000° C., typically 300° C. to 900° C., e.g. 800° C. by microwaves. If the substrate temperature is too elevated, water cooling is effected to the substrate holder 13. If the substrate temperature is too low, the substrate is heated from the holder side by means of a heating means (not shown).

In accordance with preferred embodiments of the present invention, some impurities may be introduced into diamond films during deposition. Examples of such impurities include S, Se and Te. In case of S, $H_2S$ or $(CH_3)_2S$ may be introduced as a dopant together with the reactive gas at volume ratio of dopant gas/alcohol=0.001 to 0.03. In the same manner, $H_2Se$, $H_2Te$, $(CH_3)_2Se$ and $(CH_3)_2Te$ can be used as dopant gases. Also, elements of Group IIb such as Zn and Cd can be introduced using a dopant gas of hydrogen or organic compound thereof. For example, $Zn(CH_3)_2$ is used as a dopant gas and introduced together with $CH_3OH$ at a volume ratio of $Zn(CH_3)_2/CH_3OH$=0.005 to 0.03.

Referring now to FIGS. 2(A) to 2(D), a method of forming a light emitting device in accordance with a first embodiment of the present invention will be explained. A diamond coating 2 is deposited on a p-type silicon semiconductor substrate 1 of a 4-inch wafer to a thickness of 0.5 to 3.0 micrometers, e.g. 1.3 micrometers, by the microwave-assisted plasma CVD method in a magnetic field as described above. The surface of the substrate 1 to be coated has been given scratches. During the deposition, $Zn(CH_3)_2$ or $B(CH_3)_3$ is introduced if desired as dopant gas together with $CH_3OH$ diluted by hydrogen at a volume ratio of $CH_3OH/H_2$=0.8. The volume ratio of dopant gas/$CH_3OH$ is 0.005 to 0.03.

Figure 2A:
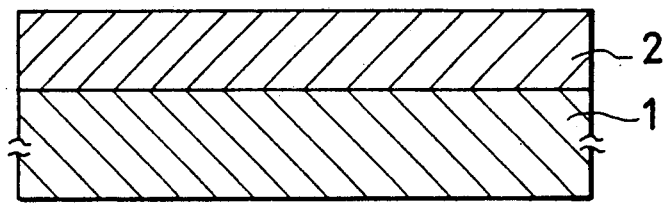
FIGS. 2(A) to 2(D) are cross sectional views showing a method of manufacturing diamond light emitting devices in accordance with the present invention.
Figure 2B:
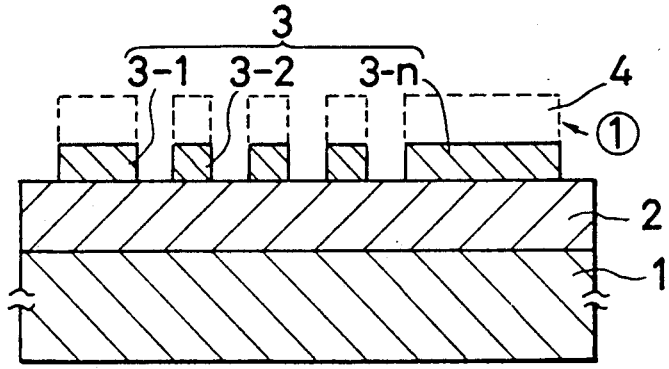
Figure 2C:
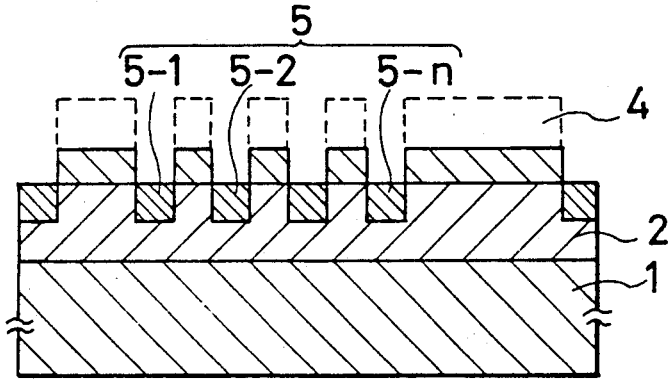
Figure 2D:
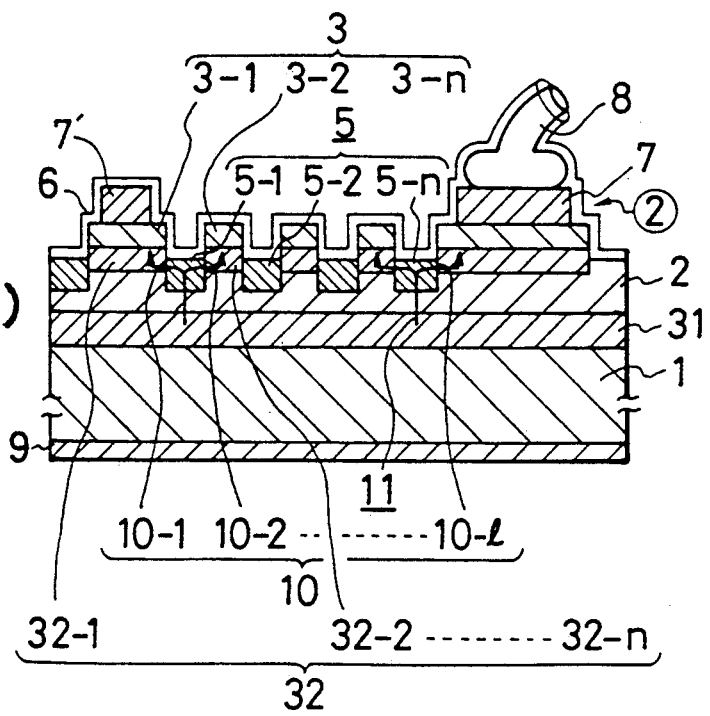

On the diamond film 2, an n-type semiconductor film 3 of silicon or a silicon carbide ($Si_xC_{1-x}$; $0<x<1$, preferably $0<x<0.5$) is deposited to a thickness of 300 angstroms to 0.3 micrometer in the same manner as the diamond film except for silane ($SiH_4$) in place of the alcohol together with a dopant gas of $PH_4$. In the case of silicon carbide, a carbon compound gas such as $CH_4$ is further introduced. The semiconductor film 3 is coated with a suitable photoresist mask 4 and patterned to leave regions 3-1, 3-2, . . . 3-n. The underlying diamond film 2 is then ion implanted S or Se with the mask 4 by an acceleration voltage of 50 to 200 KeV to a density of $1\times10^{18}$ to $3\times10^{20}$ cm$^{-3}$, e.g. $2\times10^{19}$ cm$^{-3}$ followed by the removal of the mask 4. The substrate 1 is subjected to thermal treatment in an oxygen atmosphere or air to introduce oxygen into the ion implanted regions 5-1 to 5-n. By this treatment, the diamond film is alloyed at the interfaces with the substrate 1 and the semiconductor film 3 to form silicon carbide regions 31 and 32. As a result, a PIN junction is formed between the substrate 1 and the semiconductor film 3. Electrodes 7 and 7' made of aluminum are deposited on the semiconductor film 3 through another photoresist mask by vapor evaporation or sputtering followed by attachment of a lead 8 by a known wire bonding technique. The upper surface of the structure is coated with a silicon nitride film 6 for the purpose of antireflection as shown in FIG. 2(D). Finally, the structure is enclosed by a transparent plastic moulding in order to obtain mechanical strength and wet-proof.

In this structure, current flows from the substrate 1 to the electrodes 7 and 7' through the silicon carbide film 31, the diamond film 2, the ion implanted regions 5-1 to 5-n respectively and the silicon carbide film 32 in this order. Light emission takes place mainly in the ion implanted regions of the diamond film 2 and for this reason light rays can emit outward without no impediment of the silicon semiconductor film 2 and the silicon carbide film 32. When a voltage of 10 to 200 V (e.g. 60 V) was applied across the diamond film 5 of the diamond light emitting device between the upper electrode 7 and the substrate 1 functioning as a counterpart lower electrode, diamond emitted blue visual light (475 nm±5 nm) at 14 cd/m² by virtue of current passing therethrough. The voltage may be applied as a DC voltage or as a pulse train at no higher than 100 Hz of a duty ratio of 50%. The light emission was not reduced even after continuing operation for a month.

A second embodiment will be described in below. This embodiment can be explained in conjunction with FIGS. 2(A) to 2(D) like the first embodiment and therefore the manufacturing process is largely similar as the first embodiment except for those particularly described in the following.

A diamond film 2 of 0.5 to 3 micrometers average thickness is deposited on an n-type silicon semiconductor substrate 1. The diamond film is not doped with any impurity. A p-type silicon semiconductor film 3 is deposited on the diamond film 2 and selectively removed to leave portion 3-1, 3-2, ... 3-n.

Next, as illustrated in FIG. 1(C), zinc is introduced into the diamond film 2 by ion implantation to $8 \times 10^{19}$ cm$^{-3}$ to form impurity regions 5-1, 5-2, ... 5-n. Alloying and metallization processes are given in the same manner as the first embodiment. Then, silicon carbide is formed between the semiconductor film 3 and the diamond film 2 by alloying. This silicon carbide regions 32 effectively function as a protector of the ion implanted diamond film 2. The optical energy gap of the silicon carbide is desirably controlled to be no lower than 2.5 eV in order not to form impediment of radiation at the diamond film 2.

In this embodiment, the structure is formed with an N-diamond-P junction which is reverse to the P-diamond-N junction of the first embodiment. An element of Group IIb instead of Group VIb is used as impurity functioning as radiation centers. When a 40 V was applied between the electrode 7 and the substrate 1, 13 cd/cm² light emission was obserbed. The illumination is darker as compared of that of the first embodiment. However, it is sufficient for commercialization.

A third embodiment will be described in below. This embodiment can be illustrated also in conjuction with FIGS. 2(A) to 2(D) like the first embodiment and therefore the manufacturing process is largely similar as the first embodiment except for those particularly described in the followings.

In this embodiment, a diamond film 2 is deposited using a boron dopant to be a p-type diamond film. An n-type silicon carbide film 3 is formed on the diamond film 2. An upper electrodes 7 and 7' are formed on the the film 3 in the same manner as the first embodiment. Then, Se (Group VIb) is introduced into the diamond film 2 by ion implantation at an acceleration voltage of 50 to 200 KeV to $1 \times 10^{19}$ to $3 \times 10^{20}$ cm$^{-3}$ to form impurity regions 5-1, 5-2, .. 5-n followed by thermal annealing in air to also introduce oxygen into the impurity regions. Accordingly, two elements of Group VIb are added to the diamond film. This embodiment is excellent in long-term stability. The emission was 20 cd/m² at 510 nm, which was greenish blue.

As described above, in accordance with the embodiments of the present invention, diamond devices can be manufactured only with two photomasks and a very high yield is expected. For example, nearly 10,000 light emitting elements of 0.8 mm ×0.8 mm can be formed within the 4-inch wafer.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, diamond electric device in accordance with the present invention can be manufactured in a multichamber apparatus comprising a first chamber for deposition of p-type semiconductors, a second chamber for deposition of diamond and a third chamber of deposition on n-type semiconductors. These chambers are coupled in series in order to streamline the deposition.

The present invention is broadly applicable to any electric device comprising a diamond film. These electric devices can be formed on a single substrate, i.e. an integrated circuit device which may consist of diamond light emitting devices, diamond diodes, diamond transistors, diamond resistances, diamond capacitors and the like. Of course, it is possible to sever a single substrate, after a number of diamond devices are formed on the substrate, into individual separate devices.

What is claimed is:

1. A diamond electric device comprising:
a semiconductor substrate;
a diamond film formed on said substrate;
a semiconductor film formed on said diamond film and an electrode arrangement formed on and making electric contact with said semiconductor film.

2. The device of claim 1 wherein an alloyed region is formed between said diamond film by a reaction therebetween and said semiconductor film.

3. The device of claim 1 wherein said electrode arrangment is formed of a metal.

4. The device of claim 3 wherein said metal is aluminum.

5. The device of claim 2 wherein said diamond film is partially doped with impurity to form an impurity region.

6. The device of claim 5 wherein said impurity is selected from Group IIb and Group VIb of the Periodic Table.

7. The device of claim 5 wherein said alloyed region and said impurity region are located adjacent to each other.

8. The device of claim 5 wherein said alloyed region and said impurity region are formed into a plurality of areas respectively which are arranged alternatively.

9. The device of claim 1 wherein said semiconductor film comprises silicon.

10. The device of claim 1 wherein the conductivity types of said substrate and said semiconductor film are opposite to each other.

11. The device of claim 1 wherein said semiconductor film comprises silicon-carbon alloy.

12. The device of claim 11 wherein said silicon-carbon alloy is silicon carbide.

13. An electric device comprising:
a semiconductor substrate;
a film comprising diamond crystals, said film being provided on said substrate;
semiconductor protrusions which are provided on and protrude from the surface of said film; and
impurity regions formed in said film, wherein said impurity regions are located between and below said semiconductor protrusions.

14. The electric device of claim 13 wherein alloyed regions are formed between said film and said semiconductor protrusions by a reaction therebetween.

15. The electric device of claim 13 wherein electrodes are provided on some of said semiconductor protrusions.

16. An electric device comprising:
a semiconductor substrate;
a film comprising diamond crystals, said film being provided on said substrate;
semiconductor protrusions which are provided on and protrude from the surface of said film;
alloyed regions formed between said film and said semiconductor protrusions by a reaction therebetween;
impurity regions formed in said film and between said alloyed regions; and
electrodes provided on some of said semiconductor protrusions,
wherein current paths are formed from said substrate to said electrodes through said film, said impurity regions, and said alloyed regions.

17. An electric device comprising:
a silicon semiconductor substrate;
a silicon-carbon alloy provided on said silicon substrate;
a film comprising diamond crystals, said film being provided on said silicon-carbon alloy;
a silicon semiconductor provided on said film; and
at least one electrode provided on said silicon semiconductor.

18. The electric device of claim 17 further comprising a silicon-carbon alloy region between said film and said silicon semiconductor.

19. The electric device claim 18 wherein said silicon-carbon alloy region comprises silicon carbide.

20. The electric device of claim 17 wherein said silicon-carbon alloy comprises silicon carbide.

21. An electric device comprising:
a silicon semiconductor substrate;
a silicon-carbon alloy provided on said silicon substrate;
a film comprising diamond crystals, said film being provided on said silicon-carbon alloy;
a silicon semiconductor provided on said film; and
at least one electrode provided on said silicon carbide semiconductor.

22. An electric device comprising:
a film comprising diamond crystals, said film being provided on a semiconductor substrate; and
a silicon semiconductor provided on said film,
wherein a silicon-carbon alloy is formed at an interface between said film and said silicon semiconductor by alloying.

23. The electric device of claim 22 wherein said silicon-carbon alloy comprises silicon carbide.

24. An electric device comprising:
a film comprising diamond crystals, said film being provided on a silicon semiconductor substrate,
wherein a silicon-carbon alloy is formed at an interface between said film and said silicon semiconductor substrate by alloying.

25. The electric device of claim 24 wherein said silicon-carbon alloy comprises silicon carbide.

* * * * *